United States Patent [19]

Fleming

[11] 4,144,524

[45] Mar. 13, 1979

[54] MAGNETO-OPTIC BUBBLE DOMAIN HISTOGRAPH INCORPORATING GRAY SCALE WEIGHTING

[75] Inventor: David L. Fleming, Edina, Minn.

[73] Assignee: Sperry Rand Corporation, New York, N.Y.

[21] Appl. No.: 773,444

[22] Filed: Mar. 2, 1977

[51] Int. Cl.² .................... G01D 7/00; G11C 11/14
[52] U.S. Cl. .................................. 340/754; 324/96; 324/122; 365/4; 340/800
[58] Field of Search .......... 340/324 R, 324 M, 378 R, 340/174 TF; 324/96, 122; 365/1, 4, 5

[56] References Cited

U.S. PATENT DOCUMENTS

| 3,824,570 | 7/1974 | DeBot ........................ 340/174 TF |
| 3,922,666 | 11/1975 | Inami et al. .................... 340/324 M |
| 3,965,299 | 6/1976 | Lin .................................. 340/324 R |
| 3,971,887 | 7/1976 | Lin et al. ........................ 340/324 R |

Primary Examiner—David L. Trafton
Attorney, Agent, or Firm—Kenneth T. Grace; William E. Cleaver; Marshall M. Truex

[57] ABSTRACT

A display system for providing a real-time, dynamic presentation of an analog signal waveform is disclosed. The system includes an A-D converter that, in turn, drives a serial string of binary weighted bubble domain generators. The bubble domain generators generate moving columns of bubble domains, the total amplitude of light that is provided by each column representing the amplitude of the analog signal waveform at each of an associated sample time. The bubble domain memory plane is of a construction to permit the columns of moving bubbles to appear as moving columns of bright spots when seen by an observer using a plane polarized light beam and an analyzer.

5 Claims, 5 Drawing Figures

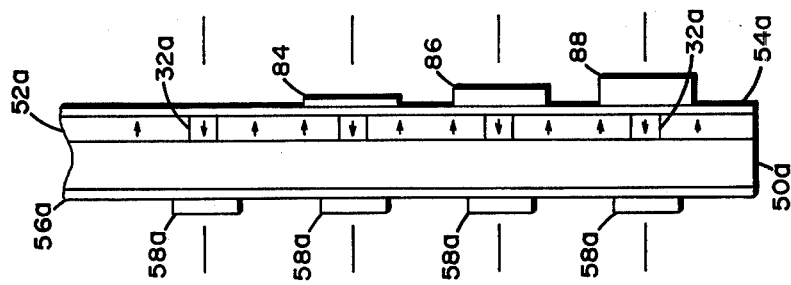
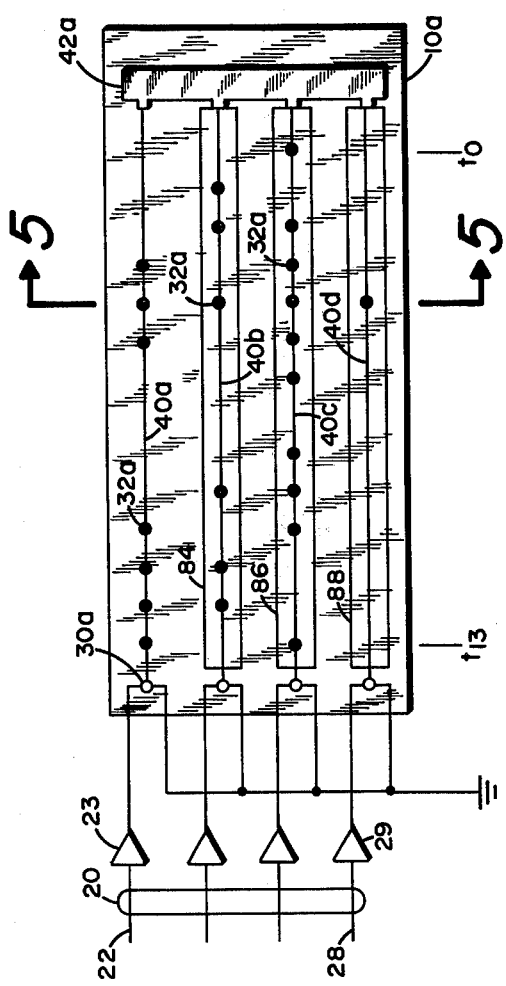

MAGNETO-OPTIC BUBBLE DOMAIN HISTOGRAPH INCORPORATING GRAY SCALE WEIGHTING

BACKGROUND OF THE INVENTION

In my copending patent application Ser. No. 704,154, filed July 12, 1976, and assigned to the Sperry Rand Corporation as is the present invention, there is disclosed a display system for providing a real-time, dynamic, area modulated presentation of an analog signal waveform — see the publication "Optical Fourier Transformation of Area-Modulated Spatial Functions," E. B. Felstead, Applied Optics, Volume 10, No. 11, November 1971, pp. 2468–2475. Such display system includes an A-D converter that is coupled to a 1-out-of-M decoder that, in turn, drives a serial string of bubble domain generators. The bubble domain generators generate moving columns of bubbles, the heights of each of the columns representing the amplitude of the analog signal waveform at each of an associated sample time. The display system includes a bubble domain memory plane that is of a construction to permit the moving columns of bubbles to appear as moving columns of bright spots when seen by an observer utilizing a plane polarized light beam and an analyzer. The present invention is considered to be an improvement thereof.

SUMMARY OF THE INVENTION

In the present invention, an analog signal is sampled in real-time and at regular sample time intervals. The sampled signal amplitudes are then digitized by an analog-to-digital converter, the binary-weighted outputs of which are each coupled to an associated one of a plurality of vertically aligned, binary-weighted, bubble domain generators. For each sample signal amplitude, the bubble domain generators generate a column of bubble domains. The columns of bubble domains are progressively moved across a bubble domain memory plane at the sampling frequency. The moving columns of bubble domains appear, to an observer, as a moving, area-modulated, display of the analog signal when utilizing a plane polarized light beam and an analyzer.

BRIEF DESCRIPTION OF THE DRAWINGS

FIG. 4 is a block diagram of a portion of a magneto-optic bubble domain histograph including a second embodiment of the bubble domain memory plane of the present invention.

FIG. 5 is a cross-sectional view of the bubble domain memory plane of FIG. 4 taken along line 5—5 thereof.

DESCRIPTION OF THE PREFERRED EMBODIMENT

Figure 1:
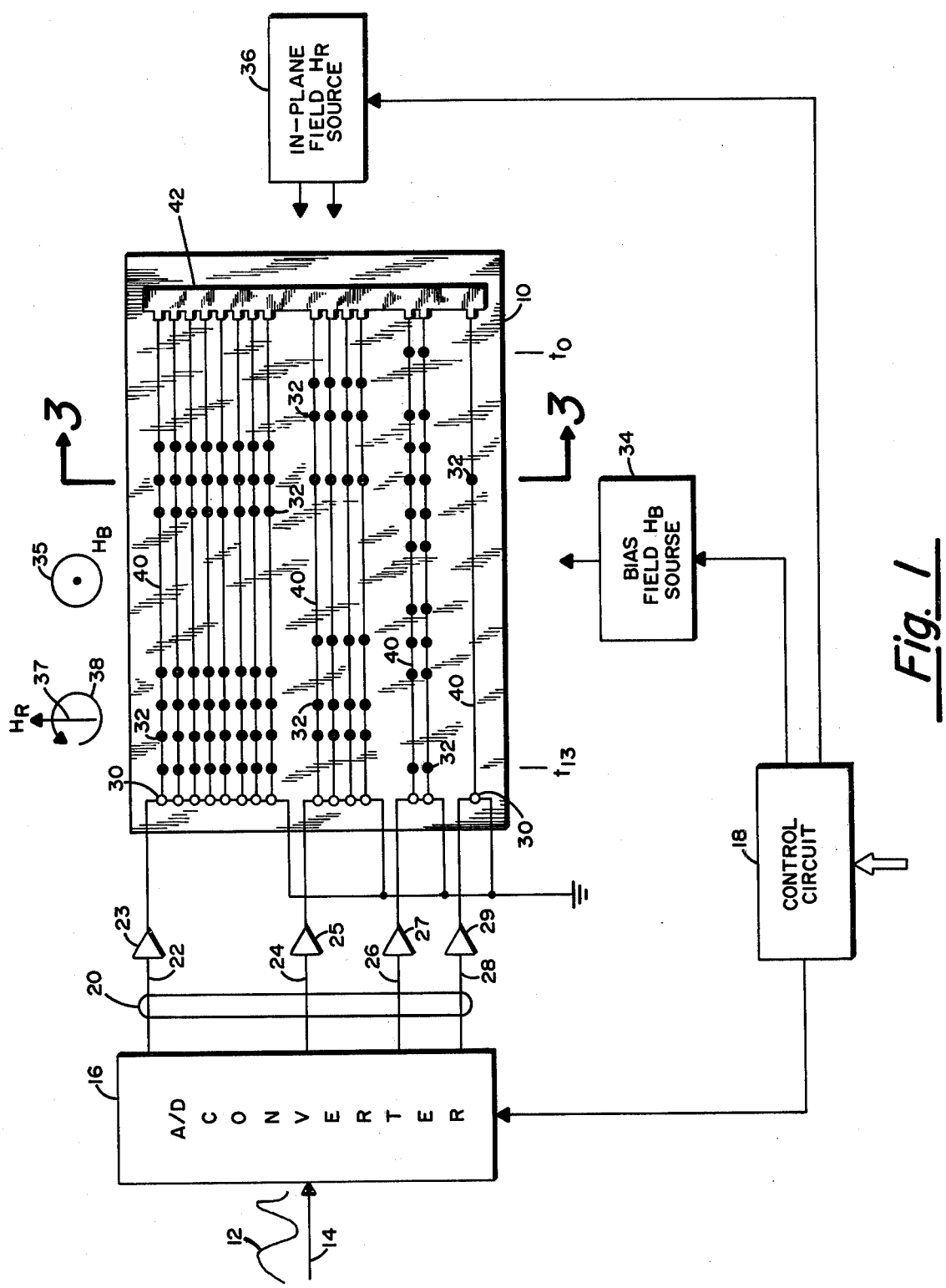
FIG. 1 is a block diagram of a magneto-optic bubble domain histograph including a first embodiment of the bubble domain memory plane of the present invention.

With particular reference to FIG. 1 there is presented a block diagram of the magneto-optic bubble domain histograph of the present invention. The analog signal 12 that is to be displayed by the bubble domain memory system on display or bubble domain memory plane 10 is, via line 14, coupled to analog-to-digital converter 16. The control circuit 18 couples the appropriate clocking signals to A-D converter 16 causing it to sample analog signal 12 at regular sample time intervals at a frequency F. The digitized representations of the sample signal amplitudes are, in turn, coupled to the output lines 22, 24, 26 and 28 of cable 20. Each of the output lines in cable 20 is a weighted binary representation of the sampled signal amplitude wherein line 22 has a weight of 8, line 24 has a weight 4, line 26 has a weight of 2 and line 28 has a weight of 1. Each of the output lines in cable 20 is, in turn, coupled to a corresponding one of the pulse generators 23, 25, 27, 29, such as a Texas Instrument TI75325 Memory Driver, and thence to the bubble domain generators 30.

Control circuit 18 couples the appropriate signals to bias field $H_B$ source 34 and to in-plane field $H_R$ source 36 for generating the corresponding bias field $H_B$, represented by the dot and concentric circle 35, which is directed normal to the plane of bubble domain memory plane 10 while in-plane field $H_R$ source 36 couples to bubble domain memory plane 10 the in-plane field $H_R$ represented by vector 37 which is a rotating field that rotates in the plane of bubble domain memory plane 10 and in the manner as represented by line 38 — see the L. J. Kochel, et al, U.S. Pat. No. 3,988,723.

Figure 2:
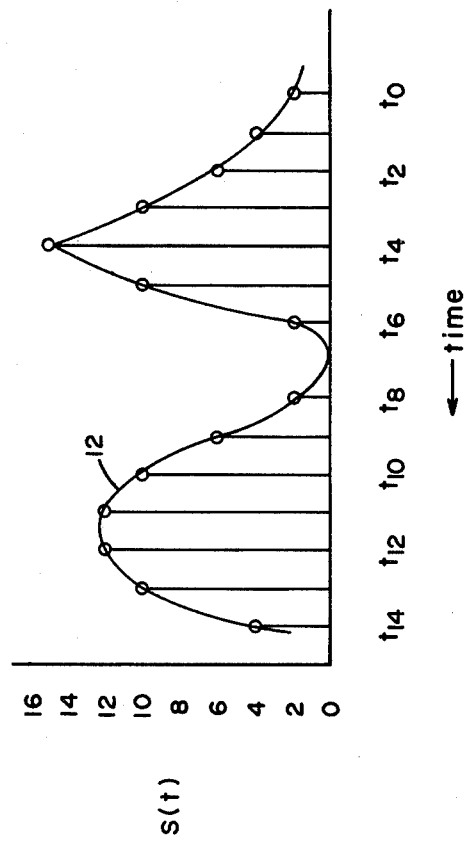
FIG. 2 is an illustration of an exemplary analog signal waveform and the corresponding digitized representations of the analog signal waveform taken at regular sample time intervals.

With particular reference to FIG. 2 there is presented an illustration of a typical analog signal 12 with the associated digitized sample signal amplitudes taken at the respective sample times $t_0$ through $t_{14}$. Reference to FIG. 1 indicates that each respective sample signal amplitude of FIG. 2 is represented by an appropriately digitized or binary-weighted equivalent group or groups of bubble domains 32. Thus, as at time $t_4$, which is along line 3—3 of FIG. 1, the sampled amplitude of analog signal 12 is 15 and is represented in bubble domain memory plane 10 by the column of eight bubble domains 32 driven by the binary-weighted 8 line 22, by the column of four bubble domains 32 driven by the binary-weighted 4 line 24, by the column of two bubble domains 32 driven by the binary-weighted 2 line 26 and by the column of one bubble domain 32 driven by the binary-weighted 1 line 26.

For each sampled signal amplitude, bubble generators 30 generate a column of bubbles 32 that is caused to move in a left to right direction along the corresponding guidance channels 40 by the in-plane field $H_R$ and the bias field $H_B$. Each column moves progressively from left to right, and at the righthand edge of bubble domain memory plane 10 it is destroyed or annihilated by annihilator 42. Control circuit 18, by causing the bubble domain generators 30 to generate a column of bubbles of a binary weighted number that is associated with each sampled signal amplitude, causes these associated bubble domains to move across bubble domain memory plane 10 at the sampling signal F so as to appear as a moving, area-modulated display of the analog signal 12. Visual observation of the moving display of bubble domains 32 may be obtained by directing a plane-polarized normally-incident, light beam upon the back surface of memory plane 10 and viewing the front surface of bubble domain memory plane 10 via an analyzer — see the D. S. Lo, et al, U.S. Pat. No. 3,761,155.

As can be seen in the illustrated embodiment of FIG. 1, line 22, being given a binary weight of 8, drives 8 serially aligned bubble domain generators 30, line 24, being given a binary weight of 4, drives 4 serially aligned bubble domain generators 30, line 26, being given a binary weight of 2, drives 2 serially aligned domain generators 30, and line 28, being given a binary weight of 1, drives a single bubble domain generator 30. In this embodiment, it can be seen that with each bubble domain 32 transmitting an equal increment of light amplitude, the energizing of line 22 by A-D converter 16 generates a column of 8 bubble domains 30 transmitting twice as much light as does the energizing of line 24 by A-D converter 16 which generates a column of four bubble domains 32.

Figure 3:
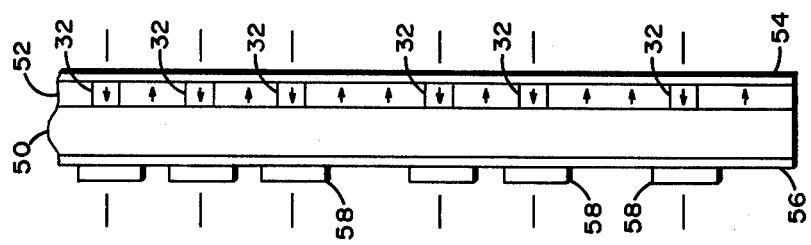
FIG. 3 is a cross-sectional view of the bubble domain memory plane of FIG. 1 taken along line 3—3 thereof.

With particular reference to FIG. 3 there is presented an illustration of a cross-sectional view of the bubble domain memory plane 10 of FIG. 1 taken along line 3—3 thereof. Bubble domain memory plane 10 is illustrated as being comprised of a substrate member 50 of Gadolinium Gallium Garnet (GGG) material of 5 millimeters (mm) in thickness on which is formed, by a liquid phase epitaxial (LPE) technique, a bubble domain supporting garnet layer 52 of 5-10 microns ($\mu$m) in thickness. Next, upon the bubble domain supporting garnet layer 52 there is formed a silicon dioxide ($SiO_2$) inclusive layer 54 of 5,000 Angstroms (Å) in thickness. Upon the back surface of substrate member 50 there is formed a silicon dioxide insulative layer 56 of 5,000 Angstroms (Å) in thickness upon which are formed a plurality of guidance channels 58, which may typically be constructed of a plurality of aligned chevron patterns of a Permalloy material such as those illustrated in the L. J. Kochel, et al, U.S. Pat. No. 3,988,723.

With particular reference to FIG. 4 there is presented a block diagram of a portion of a magneto-optic bubble domain histograph including a second embodiment of the bubble domain memory plane 10a of the present invention. In this embodiment, each of the output lines 22, 24, 26 and 28 of A-D converter 16 are weighted in a binary representation of the sample signal amplitude in the same manner as in the first embodiment of FIG. 1; however, in this second embodiment of FIG. 4, the binary weight of the guidance channels 40a, 40b, 40c and 40d, which are associated with the binary-weighted lines 22, 24, 26 and 28, respectively, have associated therewith light absorptive metallic layers that absorb the light transmitted by the respectively associated bubble domains 32 in a weighted amplitude relationship of 1, 2, 4, 8, respectively. As an example, where there are M propagation paths 40, the binary-weighted absorptive characteristics of the light absorptive layers may be expressed as having the respective binary weights:

$$2^{M-1}, 2^{M-2}, \ldots 2^1, 2^0,$$

and where M = 4, as in FIG. 4, $$2^3, 2^2, 2^1, 2^0 = 8:4:2:1.$$

With particular reference to FIG. 5 there is presented a cross-sectional view of bubble domain memory plane 10a of FIG. 4 taken along 5—5 for the purpose of illustrating that bubble domain memory plane 10a is substantially similar to bubble domain memory plane 10 of FIG. 1 except for the addition of the light absorptive layers 84, 86, 88 associated with the guidance channels 40b, 40c and 40d, respectively. Absorptive layers 84, 86 and 88 are of light absorptive characteristics such that the light amplitude provided by each of the bubble domains 32a along guidance channels 40a, 40b, 40c and 40d are of the respective light amplitudes 8:4:2:1. Thus, e.g., at time $t_{13}$ the amplitude of the sampled portion of analog signal 12 is, in a digital representation, $$1010_2 = 2^1 + 2^0 + 2^1 + 2^0 = 10_{10}.$$

Thus, it can be seen that the present invention provides a novel display system for providing a real-time, amplitude-modulated presentation of an analog signal waveform. The display system includes means for generating moving columns of bubble domains that transmit light, the amplitude of the light being a representation of an amplitude of the analog signal at an associated sample time. The bubble domains are weighted in a binary coded manner for providing a maximum range of light amplitudes with a minimum number of bubble domains per column. Accordingly, the light emitted by the bubble domain memory plane is an area-modulated representation of the analog signal.

What is clamed is:

1. A bubble domain histograph, comprising:
   analog-to-digital converter means for receiving an analog signal and converting each of a plurality of sampled signal amplitudes, at a sampling frequency F, to its digital equivalent of M bits;
   M output line means coupled to said analog-to-digital converter means for receiving said digital equivalent of each of said analog signal sample amplitudes as energized selected ones of said M output line means;
   a bubble domain memory plane comprising:
   M horizontally aligned groups of bubble domain propagation paths;
   M vertically aligned groups of column forming bubble domain generators, each bubble domain generator coupled to only an associated separate one of said groups of bubble domain propagation paths;
   means for coupling each of said groups of column forming bubble domain generators to only an associated separate one of said M output line means;
   control means controlling said column forming bubble domain generators and generating bubble domains in selected ones of said groups of bubble domain propagation paths at said frequency F, each of said selected groups of bubble domain propagation paths determined by the respectively associated energized ones of said M output line means, for moving each discrete bubble domain along its associated bubble domain propagation path at said frequency F to form a real-time display of said analog signal.

2. The bubble domain histographs of claim 1 in which said M horizontally aligned groups of bubble domain propagation paths have $$2^{M-1}, 2^{M-2}, \ldots 2^0$$

bubble domain propagation paths in the respectively associated group of bubble domain propagation paths.

3. The bubble domain histograph of claim 2 in which each of said bubble domains emits an equal light amplitude.

4. A bubble domain histograph, comprising:
   sampling means receiving an analog signal for sampling said analog signal at a sampling frequency F and coupling, at said sampling signal F, energizing signals to selected energized ones of M output lines, which energized output lines are representative of the digital equivalent of the sampled signal amplitude at the associated sample time;

a bubble domain memory plane comprising:

M horizontally aligned bubble domain propagation paths;

M bubble domain generators, each one coupled to only an associated separate one of said propagation paths;

means for coupling each of said M bubble domain generators to an associated separate one of said M output lines;

a plurality of light absorptive layers, a separate one associated with each of at least M-1 of said M propagation paths, having binary-weighted light absorptive characteristics for emitting light from each of said M propagation paths at a binary-weighted amplitude of $2^{M-1}, 2^{M-2}, \ldots 2^0$; and, control means controlling said sampling means and said M bubble domain generators and generating bubble domains when affected by said energizing signals at said frequency F, and coupling said bubble domains to said associated propagation paths at said frequency F for forming a real-time display of said analog signal by propagating said bubble domains along their associated propagation paths at said frequency F.

5. A histograph, comprising:

sampling means receiving an analog signal for sampling said analog signal at a sampling frequency F and coupling, at said sampling signal F, energizing signals to selected energized ones of M output lines, which energized output lines are representative of the binary coded equivalent of the sampled signal analog amplitude at the associated sample time;

a display device including M horizontally aligned light emitting area propagation paths, each having the associated light amplitude emitting binary weights of $2^{M-1}, 2^{M-2}, \ldots 2^0$;

M generators, each one coupled to only an associated separate one of said M propagation paths;

means coupling each of said M generators to an associated seperate one of said M output lines for coupling said binary-weighted light emitting areas to the associated one of said M propagation paths, said binary-weighted light emitting areas emitting light from each of said M propagation paths at said binary-weighted light amplitude representation of $2^{M-1}, 2^{M-2}, \ldots 2^0$; and, control means controlling said sampling means and said M generators for generating light emitting areas when affected by said energizing signals at said frequency F, said light emitting areas propagating along said associated propagation paths at said frequency F for forming a real-time optical display of said analog signal.

* * * * *